United States Patent
Lee

(10) Patent No.: US 7,199,458 B2
(45) Date of Patent: Apr. 3, 2007

(54) STACKED OFFSET SEMICONDUCTOR PACKAGE AND METHOD FOR FABRICATING

(75) Inventor: Chan-Suk Lee, Cheonan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 69 days.

(21) Appl. No.: 10/763,164

(22) Filed: Jan. 26, 2004

(65) Prior Publication Data
US 2004/0164392 A1    Aug. 26, 2004

(30) Foreign Application Priority Data
Feb. 20, 2003    (KR)    .................... 10-2003-0010761

(51) Int. Cl.
H01L 23/02     (2006.01)
H01L 25/065    (2006.01)
H01L 25/10     (2006.01)
H01L 25/18     (2006.01)

(52) U.S. Cl. ............. 257/686; 257/E23.172; 257/E25.013; 257/E23.176; 257/E25.011; 257/E21.536; 257/E23.052; 257/E25.13; 257/E23.146; 257/E23.272; 257/E23.079; 257/E23.125; 257/E23.142; 257/777; 257/723; 257/784; 257/786; 257/698; 257/685; 257/E23.036

(58) Field of Classification Search ............. 257/686, 257/685, 723, 777, 786, 784, 698, 773, E23.172, 257/E25.013, E23.176, E21.526, E25.011, 257/E23.052, E25.146, E23.036, E23.079
See application file for complete search history.

(56) References Cited

U.S. PATENT DOCUMENTS

| | | | |
|---|---|---|---|
| 6,239,496 B1 * | 5/2001 | Asada | 257/777 |
| 6,376,904 B1 * | 4/2002 | Haba et al. | 257/686 |
| 6,476,506 B1 * | 11/2002 | O'Connor et al. | 257/786 |
| 6,552,426 B2 * | 4/2003 | Ishio et al. | 257/692 |
| 6,605,875 B2 * | 8/2003 | Eskildsen | 257/777 |
| 6,621,169 B2 * | 9/2003 | Kikuma et al. | 257/780 |
| 6,882,171 B2 * | 4/2005 | Ong | 324/765 |
| 6,900,528 B2 * | 5/2005 | Mess et al. | 257/686 |
| 7,132,752 B2 * | 11/2006 | Saeki | 257/777 |
| 2002/0140107 A1 * | 10/2002 | Kato et al. | 257/777 |
| 2003/0011060 A1 * | 1/2003 | Le et al. | 257/684 |
| 2003/0141582 A1 * | 7/2003 | Yang et al. | 257/686 |
| 2003/0153122 A1 * | 8/2003 | Brooks | 438/107 |
| 2003/0155659 A1 * | 8/2003 | Verma et al. | 257/777 |
| 2003/0217858 A1 * | 11/2003 | Ho et al. | 174/52.1 |
| 2004/0012081 A1 * | 1/2004 | Kwon | 257/678 |

(Continued)

FOREIGN PATENT DOCUMENTS

JP    2001-7278    *    1/2001

*Primary Examiner*—Alexander Oscar Williams
(74) *Attorney, Agent, or Firm*—Harness, Dickey & Pierce, P.L.C.

(57) ABSTRACT

In the stacked semiconductor package, on a first semiconductor chip, a second semiconductor chip is stacked offset such that a portion of the first semiconductor chip is exposed. At least one first conductor electrically connects the exposed portion of the first semiconductor chip to the second semiconductor chip. The first conductor may be formed such that the first conductor does not extend beyond a periphery of the first semiconductor chip. The first conductor electrically connects at least one bond pad on the first semiconductor chip with at least one bond pad on the second semiconductor chip, and a redistribution pattern electrically connects the bond pad on the second semiconductor chip to a differently positioned bond pad on the second semiconductor chip.

20 Claims, 2 Drawing Sheets

U.S. PATENT DOCUMENTS

| | | | |
|---|---|---|---|
| 2004/0033673 A1* | 2/2004 | Cobbley et al. | 438/455 |
| 2004/0051119 A1* | 3/2004 | Kikuma et al. | 257/200 |
| 2004/0184250 A1* | 9/2004 | Wang | 361/790 |
| 2005/0067694 A1* | 3/2005 | Pon et al. | 257/723 |
| 2005/0139985 A1* | 6/2005 | Takahashi | 257/698 |
| 2006/0076690 A1* | 4/2006 | Khandros et al. | 257/777 |
| 2006/0091518 A1* | 5/2006 | Grafe et al. | 257/686 |

* cited by examiner

STACKED OFFSET SEMICONDUCTOR PACKAGE AND METHOD FOR FABRICATING

This application claims priority under 35 U.S.C. § 119 of Korean Patent Application No. 2003-10761, which was filed on Feb. 20, 2003, in the Korean Intellectual Property Office, the disclosure of which is incorporated by reference herein in its entirety.

BACKGROUND OF THE INVENTION

1. Field of the Invention

The present invention relates to a semiconductor package and method for fabricating. More particularly, the present invention relates to a method for stacking semiconductor chips and forming a stacked semiconductor package including a plurality of semiconductor chips in one semiconductor package.

2. Description of the Related Art

While semiconductor manufacturing technologies have improved the integrity and decreased the size of semiconductor devices, fabricating a semiconductor package can still be expensive and burdensome. In particular, in a wafer fabricating process, a large financial investment must be made for upgraded facilities and new equipment in addition to research costs. In the case of semiconductor memory devices, the process of upgrading from 64-megabit Dynamic Random Access Memory (DRAM) to 256-megabit DRAM can be costly when requiring a new wafer fabricating process.

Semiconductor manufacturers have introduced a method for fabricating a semiconductor package by placing a plurality of semiconductor chips into one semiconductor package. The process of a stacked semiconductor package includes stacking at least two semiconductor chips. The stacking of the semiconductor chips provides a solution to improving the integrity and performance of the semiconductor package without the need for fabricating an entirely new wafer. For example, the 256-megabit DRAM can be fabricated by assembling the semiconductor package with four 64-megabit DRAM semiconductor chips.

In previous methods for fabricating a multi-chip semiconductor package, the semiconductor package is made by stacking multiple unit semiconductor chips on top of one another. One such method for fabricating a stacked semiconductor package is disclosed in U.S. Pat. No. 6,239,496 entitled "Package Having Very Thin Semiconductor Chip, Multichip Module Assembled By The Package And Method For Manufacturing The Same."

However, this type of multi-chip semiconductor package requires a new assembly method, new materials, and complex fabrication processes.

SUMMARY OF THE INVENTION

The present invention provides a stacked semiconductor package and method of fabricating the same using conventional equipment and processes that allow for fabrication with reduced cost.

In one exemplary embodiment of the stacked semiconductor package, on a first semiconductor chip, a second semiconductor chip is stacked offset such that a portion of the first semiconductor chip is exposed. At least one first conductor electrically connects the exposed portion of the first semiconductor chip to the second semiconductor chip.

In one exemplary embodiment, the first conductor does not extend beyond a periphery of the first semiconductor chip.

In another exemplary embodiment, the first conductor electrically connects at least one bond pad on the first semiconductor chip with at least one bond pad on the second semiconductor chip, and a redistribution pattern electrically connects the bond pad on the second semiconductor chip to a differently positioned bond pad on the second semiconductor chip. This embodiment may further include a frame supporting a chip package structure formed of at least the first and second semiconductor chips. And at least one second conductor may electrically connect the differently positioned bond pad to the frame. In other embodiments, a plurality of first conductors and/or a plurality of second conductors exist.

BRIEF DESCRIPTION OF THE DRAWINGS

The above features and other advantages of the present invention will become more apparent by describing exemplary embodiments in detail with reference to the accompanying drawings, in which.

DETAILED DESCRIPTION OF THE INVENTION

Figure 1:
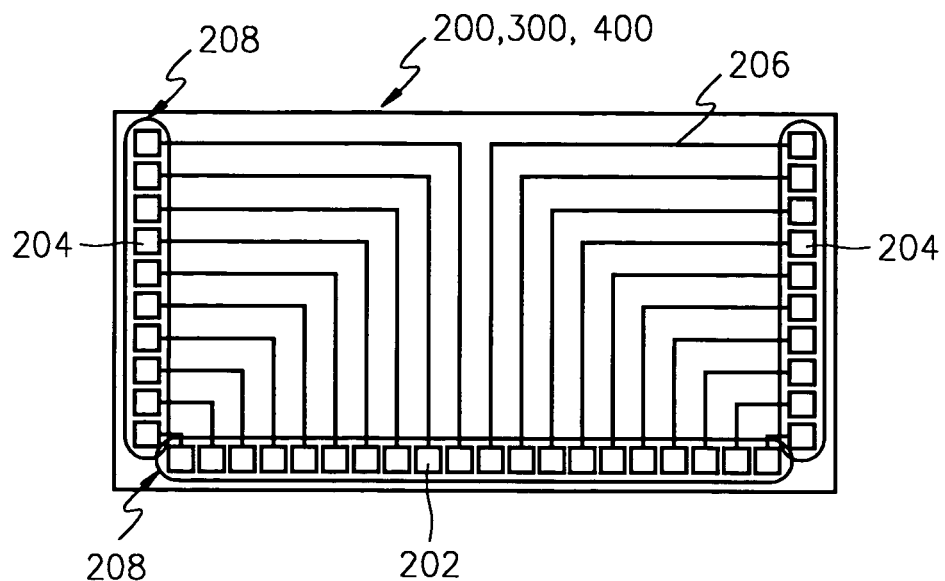
FIG. 1 is a top view of a redistribution pattern on a semiconductor chip in a semiconductor chip package according to an embodiment of the present invention.

Hereinafter, exemplary embodiments of the present invention will be described in detail with reference to the accompanying drawings. In the following drawings, like reference numerals identify similar or identical elements.

FIG. 1 is a top view of a redistribution pattern 206 on an upper surface of a semiconductor chip according to an embodiment of the present invention. The redistribution pattern 206 may be formed on any of the semiconductor chips within a stacked semiconductor package of an exemplary embodiment of the invention. As shown, a plurality of first bond pads 202 are formed along an edge of the semiconductor chip 200, 300, 400. A plurality of second bond pads 204 are formed along opposite edges of the semiconductor chip 200, 300, 400. The redistribution pattern 206 is a pattern of wires that electrically connects respective first bond pads 202 to respective second bond pads 204. In the exemplary embodiment of FIG. 1, a one-to-one correspondence exists between the first and second bond pads 202 and 204, but the present invention is not limited to this arrangement. Also, the redistribution pattern 206 may be changed to accommodate any location of the first or second bond pad 202 and 204. Namely, the present invention is not limited to the positions of the first and second bond pads 202 and 204 shown in FIG. 1. In one exemplary embodiment, the first bond pad 202 is formed by a flexible wire bonding process that is based on the location of the second bond pad 204. In creating the first bond pads 202, the redistribution pattern 206 and the second bond pads 204 are formed on a film located at the uppermost part of a semiconductor chip. Next, an insulating film, for example a polyimide film, is coated on the semiconductor chip on which the redistribution pattern 206 and the second bond pad 204 are formed. After that, the portion of the semiconductor chip where the bond pads are to be etched 208 is etched to expose the first 202 and second 204 sets of bond pads.

Figure 2:
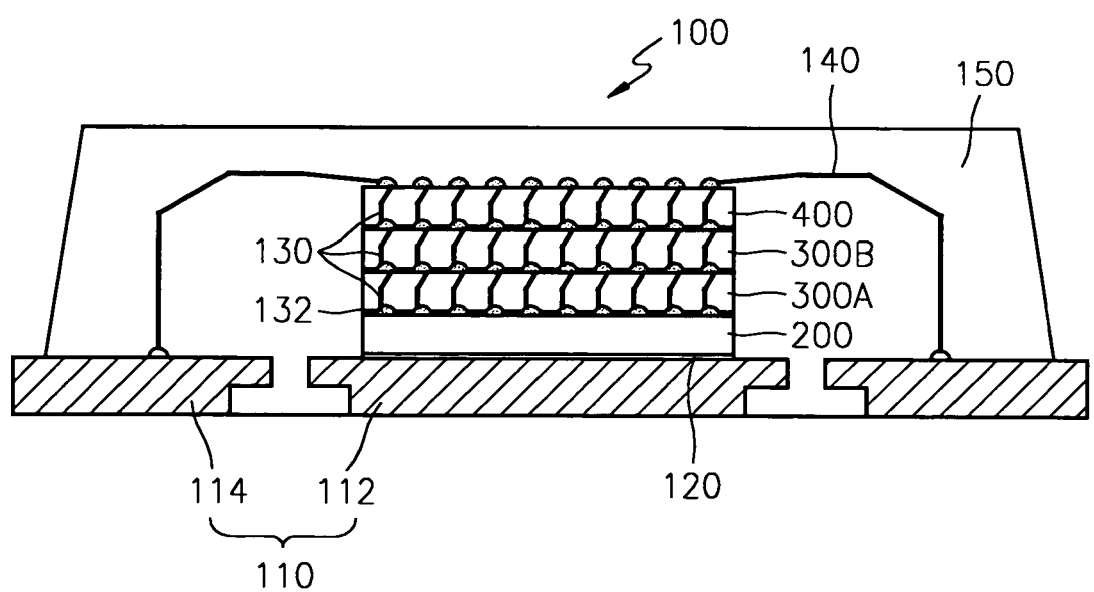
FIG. 2 is a side view of a stacked semiconductor package according to an embodiment of the present invention.

Referring to FIG. 2, the stacked semiconductor package 100 according to an exemplary embodiment of the present invention includes a frame 110, which may be a printed circuit board used for a Ball Grid Array (BGA) package or a flexible substrate (the flexible substrate is also referred to as an insulated wiring board). In an example of the present invention the stacked semiconductor package is a Chip Scale Package (CSP) or a Quad-Flat No-lead (QFN) semiconductor package. As shown, in an exemplary embodiment, the stacked semiconductor package 100 is mounted to the die pad 112 using an insulating adhesive tape 120. Here, the insulating adhesive tape 120 is attached to a rear surface of a wafer from which the first semiconductor chip 200 is formed before a sawing process of the stacked semiconductor package 100 fabrication process.

The frame 110 used in the QFN semiconductor package includes a die pad 112 and an inner lead 114. The die pad 112 represents a portion where a first semiconductor chip 200, middle semiconductor chips 300A, 300B and a fourth semiconductor chip 400 of the QFN semiconductor package are mounted within the package 100 fabrication process. The inner lead 114 represents a portion where the stacked semiconductor chip package 100 is electrically connected to the frame 110.

The stacked semiconductor package 100 according to an exemplary embodiment of the present invention comprises first wires 130, for example, bonding wires, for electrically connecting respective first bond pads of the lower semiconductor chip 200, the middle semiconductor chips 300A and 300B, and the upper semiconductor chip 400 to each other. A ball bonding process is used to bond the first wires 130 to the first bond pads 202 on the exposed portion of the lower semiconductor chip 200, and a stitch bonding process is used to bond the first wires 130 to the first bond pads 202 of the middle and upper semiconductor chips 300A, 300B and 400.

The stacked semiconductor package 100 according to an exemplary embodiment of the present invention includes second wires 140, for example, bonding wires for electrically connecting the inner lead 114 of the frame 110 with respective second bond pads of the upper semiconductor chip 400.

Also the stacked semiconductor package 100 includes a sealing resin 150 for sealing the semiconductor chips 200, 300A, 300B, and 400, the wires 130 and 140, and a part of the frame 110. The sealing resin 150 may be an Epoxy Mold Compound (EMC).

As described in detail below with respect to FIGS. 3 and 4, the semiconductor chips of FIG. 2 are stacked in an offset fashion in order to expose the first bond pads 202 on one edge of the first and middle semiconductor chips 200, 300A and 300B. The offset stacking of the semiconductor chips in the QFN configuration exposes the first bond pads 202, the semiconductor chips 200, 300A and 300B such that the conductors 130 may electrically connect the respective first bond pads 202 of the chips.

Figure 3:
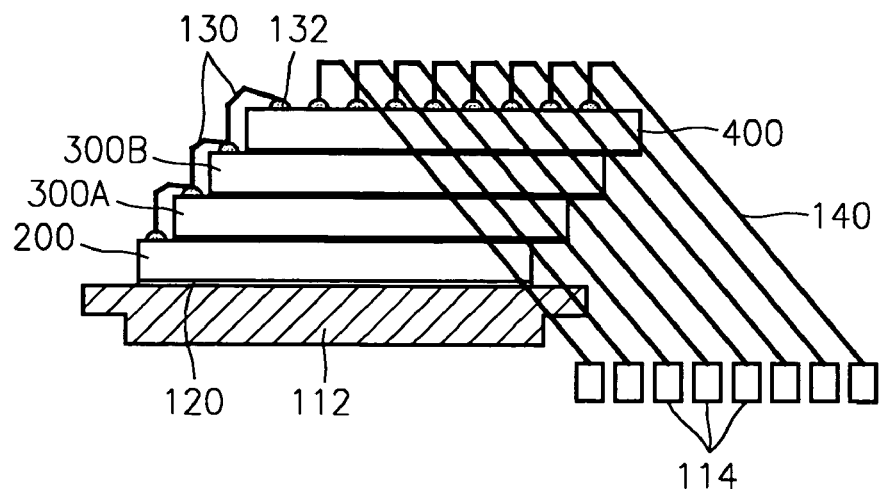
FIG. 3 is another side view of stacked semiconductor package according to an embodiment of the present invention.
Figure 4:
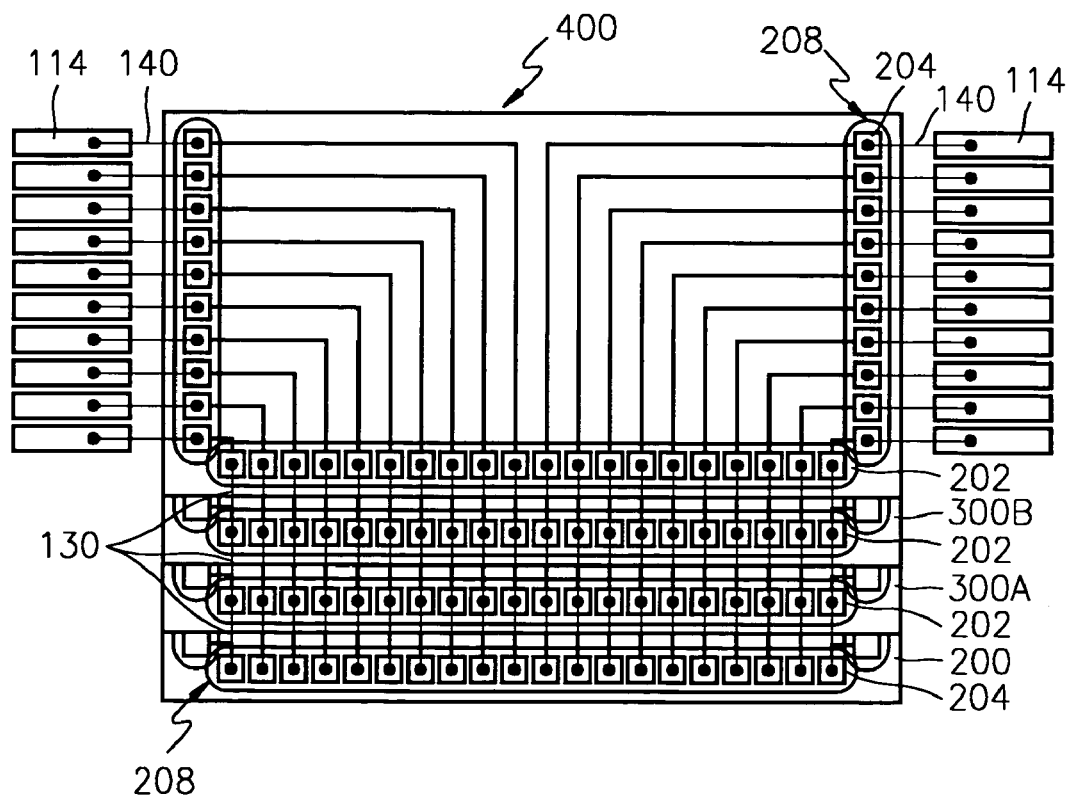
FIG. 4 is a top view of stacked semiconductor package according to an embodiment of the present invention.

FIG. 3 is a side view of the stacked semiconductor package illustrated in FIG. 2, and FIG. 4 is a top view of the stacked semiconductor chip package in FIG. 2.

Referring to FIG. 3, in an exemplary embodiment of the present invention the lower, middle, and upper semiconductor chips 200, 300A, 300B, and 400 are mounted on the die pad 112 of the frame in a offset or stepped shape. This exposes an edge portion of the first and middle semiconductor chips 200, 300A and 300B such that the first bond pads 202 on one edge of each chip are exposed. As such, the first conductors 130 may electrically connect, for example by wirebonding, respective first bond pads 202 of the first, middle and upper semiconductor chips 200, 300A, 300B and 400 together. When, in an exemplary embodiment the first conductors 130 are wires, the connecting portion 132 of the first wires 130 on the middle and upper semiconductor chips 300A, 300B, and 400 are formed by performing a ball-bonding process or a stitch-bonding process.

As further shown in FIGS. 3 and 4, the second conductors 140 electrically connect respective second bond pads 204 of the upper semiconductor chip 400 to the connection unit of the frame 110, for example, the inner lead 114. Thus, the first wires 130 and the second wires 140 may be wire-bonded in different directions and location to use space efficiently. Also, the second bond pads 204 of upper semiconductor chip 400 and the first bond pads 202 of the lower, middle, and upper semiconductor chips 200, 300A, 300B, and 400 respectively, are exposed for the connection of the first and second wires 130 and 140.

To fabricate the stacked semiconductor package according to the present invention, the frame 110 is prepared along with the lower, middle, and upper semiconductor chips 200, 300A, 300B, and 400 by assuring the proper bond pad distribution prior to the process of stacking the semiconductor chips. Following these preparations, the lower, middle, and upper semiconductor chips 200, 300A, 300B, and 400 are mounted on the die pad 112 of the frame 110 in a stepped shape so that the first bond pads 202 are exposed as shown in FIGS. 3 and 4. The semiconductor chips are attached by insulating adhesive tape 120 attached on the bottom surfaces of the semiconductor chips 200, 300A, 300B, and 400.

Then, the second bond pads of the lower, middle, and upper semiconductor chips 200, 300A, 300B, and 400 are wire-bonded with each other by the first wires 130. The wire bonding process includes the ball-bonding process, which is generally performed on the first bond pads on an exposed portion of a lower semiconductor chip 200 and a stitch-bonding process, which is usually performed on the first bond pads 202 on the middle and upper semiconductor chips 300A, 300B and 400. In addition, the second bond pad's 204 of the upper semiconductor chip 400 and the connection unit such as the inner lead 114 of the frame 110 are wired-bonded by the second wires 140. The resultant bonded wires are sealed with a sealing resin 150, for example, an EMC as shown in FIG. 2. In the case where the frame 110 is a printed circuit board or an insulating wiring board, solder balls may be selectively attached thereto.

In an exemplary embodiment of the present invention the lower, middle and upper semiconductor chips 200, 300A, 300B, and 400 are semiconductor devices of the same kind, for example, dynamic random access memories (DRAMs). However, different types of semiconductor devices can be used if necessary as well as a variable number of semiconductor chips within the package.

According to the present invention, the stacked semiconductor package is capable of performing with improved functionality within a minimal area. This can be realized by improving the stacking method of semiconductor chips and the wire-bonding method. Further, the stacked semiconductor package can be made with relative ease and the cost of equipment investment can be reduced since conventional equipment and processes are used.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A stacked semiconductor package comprising:
a first semiconductor chip;
a second semiconductor chip stacked offset over the first semiconductor chip such that a portion of the first semiconductor chip is exposed and at least one bottom corner of the second semiconductor chip is exposed;
at least one first conductor electrically connecting the exposed portion of the first semiconductor chip to the second semiconductor chip, the first conductor not extending beyond a periphery of the first semiconductor chip;
at least one second conductor electrically connecting the second semiconductor chip to a frame; and
a redistribution pattern electrically connecting the first plurality of bond pads on the second semiconductor chip to a second plurality of bond pads on the second semiconductor chip, the second plurality of bond pads arranged adjacent to a different edge of the second semiconductor chip.

2. The package of claim 1, wherein
the first conductor electrically connects at least one bond pad on the first semiconductor chip with at least one bond pad on the second semiconductor chip.

3. The package of claim 2, further comprising:
a frame supporting a chip package structure, the chip package structure including at least the first and second semiconductor chips; and
at least one second conductor electrically connecting the second plurality of bond pads to the frame.

4. The package of claim 3, wherein the second conductor electrically connects the second plurality of bonds pads to a bond pad on the frame.

5. The package of claim 1, wherein a plurality of first conductors electrically connect the exposed portion of the first semiconductor chip to the second semiconductor chip, the plurality of first conductors not extending beyond a periphery of the first semiconductor chip.

6. The package of claim 5, further comprising:
the plurality of first conductors respectively electrically connecting a plurality of bond pads on the first semiconductor chip to a first plurality of bond pads on the second semiconductor chip.

7. The package of claim 6, wherein the plurality of bonds pads on the first semiconductor chip are arranged adjacent to an edge of the first semiconductor chip, and the first plurality of bond pads on the second semiconductor chip are arranged adjacent to an edge of the second semiconductor chip, the edge of the second semiconductor chip corresponding to the edge of the first semiconductor chip.

8. The package of claim 6, further comprising:
the frame supporting a chip package structure, the chip package structure including at least the first and second semiconductor chips; and
a plurality of second conductors electrically connecting the second plurality of bond pads on the second semiconductor chip to the frame.

9. The package of claim 8, wherein the frame is one of a printed circuit board and a flexible substrate.

10. The package of claim 8, wherein the frame includes a die pad portion supporting the chip package structure and an inner lead portion to which the plurality of second conductors are electrically connected.

11. The package of claim 10, further comprising:
a sealing resin sealing the first and second semiconductor chips, the redistribution pattern, the first and second plurality of conductors, and a portion of the frame.

12. The package of claim 8, wherein the plurality of first and second conductors are bonding wires.

13. A stacked semiconductor package comprising:
a first semiconductor chip;
a plurality of intermediate semiconductor chips n, where $n \geq 0$, each intermediate semiconductor chip stacked offset over the first semiconductor chip such that a portion of the first semiconductor chip and at least one bottom corner of each intermediate chip is exposed;
a second semiconductor chip, wherein when the expression $n>0$ is satisfied, the second semiconductor chip is stacked offset over the intermediate semiconductor chips such that a portion of each intermediate semiconductor chip and at least one bottom corner of the second semiconductor chip are exposed, and when the expression $n=0$ is satisfied, the second semiconductor chip is stacked offset over the first semiconductor chip such that the portion of the first semiconductor chip and the at least one bottom corner of the second semiconductor chip are exposed;
at least one first conductor electrically connecting the exposed portions of the first and intermediate semiconductor chips to the second semiconductor chip, the first conductor not extending beyond a periphery of the first semiconductor chip;
at least one second conductor electrically connecting the second semiconductor chip to a frame, and
a redistribution pattern electrically connecting the first plurality of bond pads on the second semiconductor chip to a second plurality of bond pads on the second semiconductor chip, the second plurality of bond pads arranged adjacent to a different edge of the second semiconductor chip.

14. The package of claim 13, wherein a plurality of first conductors electrically connect bonding pads on the exposed portions of the first and intermediate semiconductor chips to a first plurality of bonding pads on the second semiconductor chip, the first conductors not extending beyond a periphery of the first semiconductor chip.

15. The package of claim 1, wherein the first and second semiconductor chips are a same type of chip.

16. A stacked semiconductor package comprising:
a stacked chip structure including an upper semiconductor chip and at least one lower semiconductor chip disposed under at least a portion of the upper semiconductor chip such that at least one bottom corner of the upper semiconductor chip is exposed; and
a redistribution pattern redistributing a first plurality of bond pads on the upper semiconductor chip to a second plurality of bond pads positioned on a different edge of the upper semiconductor chip, the first plurality of bond pads being electrically connected with the lower semiconductor chip.

17. A method for fabricating a stacked semiconductor package, comprising:
forming a stacked chip package including at least a first semiconductor chip and a second semiconductor chip stacked offset over the first semiconductor chip such that a portion of the first semiconductor chip and at least one bottom corner of the second semiconductor chip is exposed;
electrically connecting the exposed portion of the first semiconductor chip to the second semiconductor chip using at least one first conductor such that the first conductor does not extend beyond a periphery of the first semiconductor chip;

electrically connecting the second semiconductor chip to a frame using at least one second conductor, and forming a redistribution pattern redistributing a first plurality of bond pads on the second semiconductor chip to a second plurality of bond pads positioned on a different edge of the second semiconductor chip.

18. A method for fabricating a stacked semiconductor package, comprising:

forming a stacked chip structure including an upper semiconductor chip and at least one lower semiconductor chip disposed under at least a portion of the upper semiconductor chip such that at least one bottom corner of the upper semiconductor chip is exposed; and electrically connecting the lower semiconductor chip with a first plurality of bond pads on the upper semiconductor chip; and forming a redistribution pattern redistributing the first plurality of bond pads on the upper semiconductor chip to a second plurality of bond pads positioned on a different edge of the upper semiconductor chip.

19. A stacked semiconductor package comprising:

a first semiconductor chip;

a second semiconductor chip stacked offset over the first semiconductor chip such that a portion of the first semiconductor chip is exposed and at least one bottom corner of the second semiconductor chip is exposed;

at least one first conductor electrically connecting the exposed portion of the first semiconductor chip to the second semiconductor chip, the first conductor not extending beyond a periphery of the first semiconductor chip; and at least one second conductor electrically connecting the second semiconductor chip to a frame, wherein at least one of the second conductors extends across a different edge of the second semiconductor chip than the first conductors.

20. A method for fabricating a stacked semiconductor package, comprising:

forming a stacked chip package including at least a first semiconductor chip and a second semiconductor chip stacked offset over the first semiconductor chip such that a portion of the first semiconductor chip and at least one bottom corner of the second semiconductor chip is exposed;

electrically connecting the exposed portion of the first semiconductor chip to the second semiconductor chip using at least one first conductor such that the first conductor does not extend beyond a periphery of the first semiconductor chip; and electrically connecting the second semiconductor chip to a frame using at least one second conductor, wherein at least one of the second conductors is formed extending across a different edge of the second semiconductor chip than the first conductors.

* * * * *